(12) United States Patent
Chen et al.

(10) Patent No.: US 7,690,418 B2
(45) Date of Patent: Apr. 6, 2010

(54) HEAT SINK

(75) Inventors: Chun-Chi Chen, Guangdong (CN);
Shih-Hsun Wung, Guangdong (CN);
Guang Yu, Guangdong (CN); Da-Yuan Zhou, Guangdong (CN); Jin-Biao Liu, Guangdong (CN)

(73) Assignees: Fu Zhun Precision Industry (Shen Zhen) Co., Ltd., Longhua Town, Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 1133 days.

(21) Appl. No.: 11/306,423

(22) Filed: Dec. 28, 2005

(65) Prior Publication Data
US 2007/0144705 A1    Jun. 28, 2007

(51) Int. Cl.
*H05K 7/20* (2006.01)
(52) U.S. Cl. .................. 165/80.3; 165/104.33; 361/700
(58) Field of Classification Search ................ 165/80.3, 165/104.33; 361/700; 11/80.3, 104.33
See application file for complete search history.

(56) References Cited
U.S. PATENT DOCUMENTS 6,125,035 A *    9/2000  Hood et al. ............ 361/679.47
6,189,601 B1 *   2/2001  Goodman et al. ........... 165/80.3
6,945,319 B1 *   9/2005  Li et al. .................. 165/104.33
6,964,295 B1 *   11/2005 Yu et al. ................. 165/104.33
6,967,845 B2 *   11/2005 Chiang et al. ............... 361/709
7,000,687 B2 *   2/2006  Ying et al. .............. 165/104.33
7,110,259 B2 *   9/2006  Lee et al. ..................... 361/700
7,363,966 B2 *   4/2008  Yu et al. ................. 165/104.33
2007/0095509 A1 * 5/2007 Lee et al. ................ 165/104.33

FOREIGN PATENT DOCUMENTS

| CN | 2605665 Y | 3/2004 |
| TW | 326939    | 2/1998 |
| TW | 332747    | 5/2003 |
| TW | M261012   | 1/2005 |

* cited by examiner

*Primary Examiner*—Allen J Flanigan
(74) *Attorney, Agent, or Firm*—Winston Hsu

(57) ABSTRACT

A heat sink for dissipating heat from an electronic element comprises a base with a plurality of first fins extending upwardly therefrom, a conducting member thermally contacting the base with a plurality of second fins extending from two opposite lateral face of the conducting member toward different directions and perpendicular to the first fins, a heat pipe connecting the base and the conducting member to transfer heat from the base to the conducting member.

13 Claims, 3 Drawing Sheets

HEAT SINK

FIELD OF THE INVENTION

The present invention relates to a heat dissipation device, and particularly to a heat sink for an integrated circuit package.

DESCRIPTION OF RELATED ART

A heat sink has become a necessary device for a high heat-generating electronic element, such as a central processing unit (CPU) or a chipset. Along with continuous development of electronic technology, electronic elements are having more functions and higher performance, and accordingly, generate more heat. An efficient heat sink is very important to insure normal operation of an electronic element. Therefore, various heat sinks are evolved to achieve timely and efficient heat dissipation for these electronic elements.

A conventional heat sink comprises a plate-shaped base with a bottom face for contacting the electronic element and a top face opposite to the bottom face. A plurality of fins extends upwardly from the top face of the base. The heat sink absorbs heat generated by an electronic component via the base, and transfers the heat upward to the fins for dissipation. In order to improve heat dissipation capability of the heat sink, a general method is to increase heat dissipation surface area so as to facilitate the heat dissipation. Thus, the dimensions of the fins are made larger and larger in response to the increase of the heat generated by the electronic element. However, in the conventional heat sink, due to the limitation of manufacture technology, the increase of the size of the fins accompanies the decrease of the fins number. Accordingly, the total heat dissipation surface area of the heat sink is not increased markedly. On the other hand, a large fin has lower utilization efficiency. A portion of the large fin remote from the base has a relative small difference in temperature from an environment, so heat exchange rate between this remote portion of the large fin and the environment is low. This problem is exacerbated when the large fin becomes larger. As a result, the volume-increased heat sink, which has large fins, occupies more room in the computer system and the heat dissipation performance thereof is not remarkably enhanced accordingly.

Therefore, it is desired to evolve a heat sink to overcome above-mentioned problems.

SUMMARY OF INVENTION

Accordingly, what is needed is a heat sink with a high ratio of heat dissipation capacity to the volume.

A heat sink comprises a base with a plurality of first fins extending upwardly therefrom and a vertical conducting member connecting with the base. A plurality of second fins extends outwardly from two sides the conducting member and is oriented perpendicular to the first fins. The second fins are located above the first fins. A heat pipe is attached to the base and a top of the conducting member to transfer heat from the base to the top of the conducting member.

Other advantages and novel features of the present invention will become more apparent from the following detailed description when taken in conjunction with the accompanying drawings, in which:

DETAILED DESCRIPTION

Figure 1:
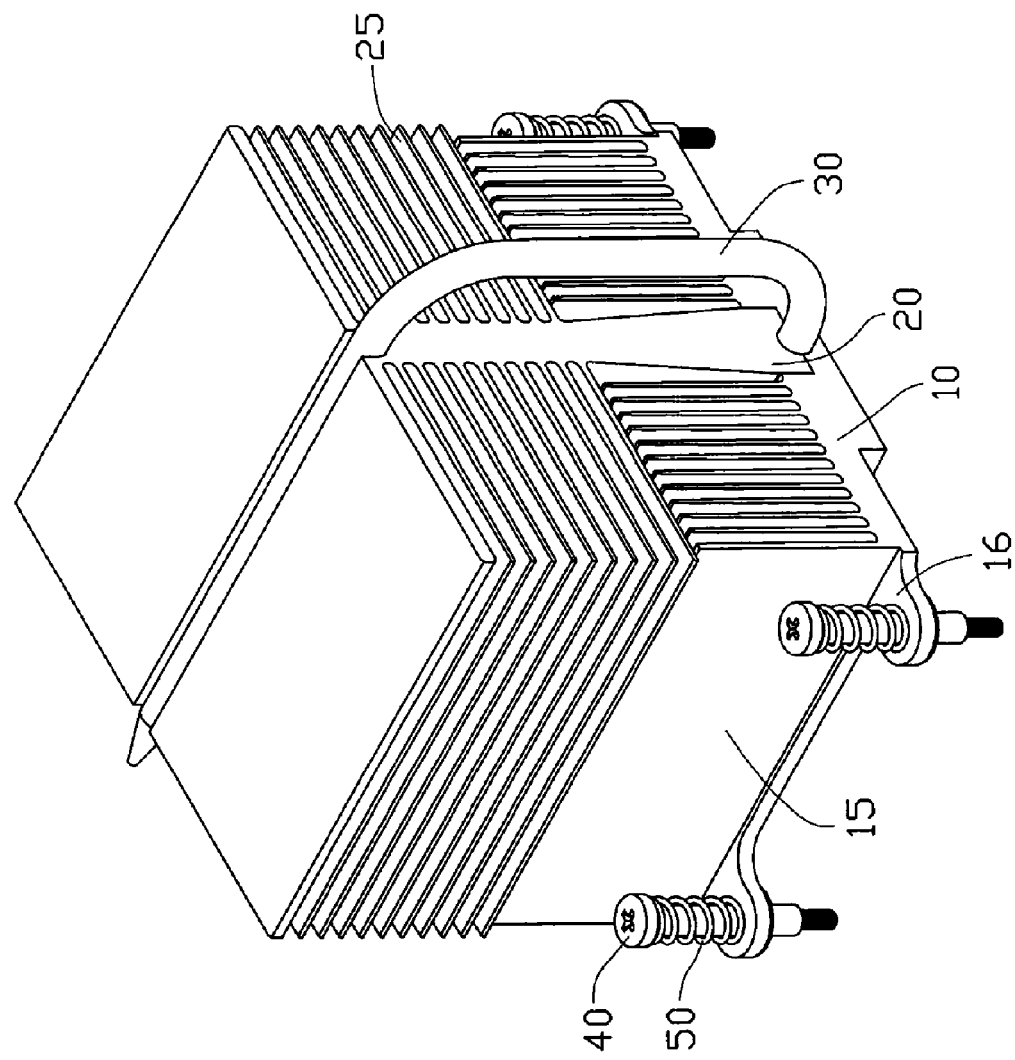
FIG. 1 is an isometric view of a heat sink in accordance with a preferred embodiment of the present invention.

Reference will now be made to the drawing figures to describe a heat sink in accordance with a preferred embodiment of the present invention.

The heat sink is for being mounted to a heat-generating electronic element, such an IC package (not shown), to dissipate heat therefrom.

Figure 2:
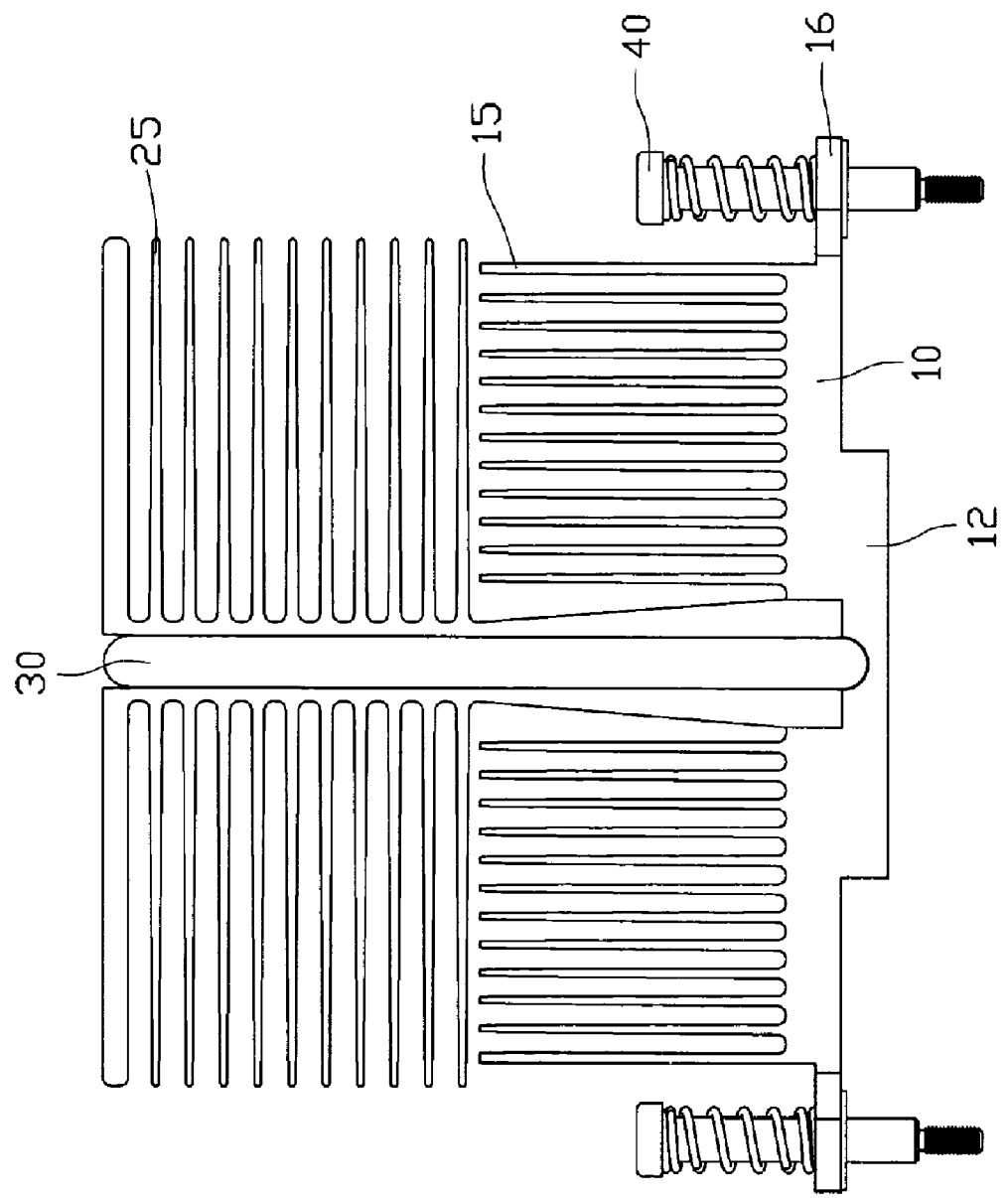
FIG. 2 is a front elevational view of FIG. 1.

Referring to FIGS. 1-2, the heat sink has a cubical configuration and comprises a base 10, a plurality of first fins 15 extending vertically upwards from the base 10, a conducting member 20 perpendicularly fixed on the base 10, and a plurality of second fins 25 extending horizontally outwardly from two opposite sides of the conducting member 20. A C-shaped heat pipe 30 thermally connects the base 10 and a top of the conducting portion 20.

Figure 3:
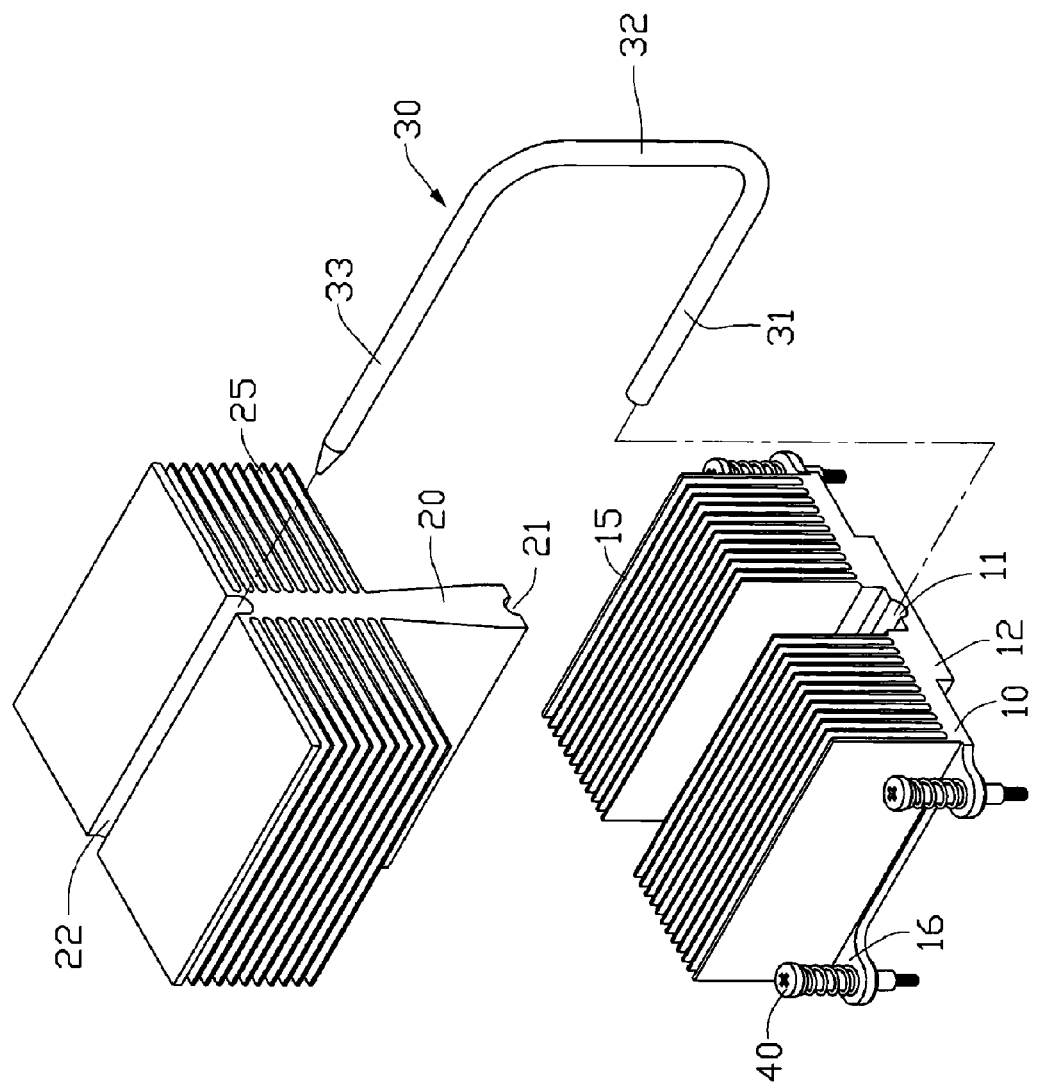
FIG. 3 is an exploded view of FIG. 1.

Referring to FIG. 3, the base 10 has a bottom face (not labeled) with a protrusion 12 formed thereon for contacting the electronic element to absorb the heat therefrom, and a top face (not labeled) with a groove 11 defined in a middle thereof. The base 10 forms four ears 16 at four corners thereof. Each ear 16 defines a mounting hole (not labeled) for receiving a screw 40 with a spring 50 to fix the heat sink to a supporting member (not shown), for example, a printed circuit board on which the electronic element is mounted. The first fins 15 extend upwardly from the top surface of the base 10 perpendicularly. The first fins 15 define a plurality of first air passages (not labeled) therebetween. The conducting member 20 is fixed on the base 10, perpendicularly located on a middle of the top face of the base 10 and the first fins 15 is arrayed as two groups by the two opposite sides of the conducting member 20, respectively. The conducting member 20 defines a groove 21 in a bottom thereof, corresponding to the groove 11 of the base 10. The two grooves 11, 21 jointly form a channel (not labeled). The conducting member 20 is oriented parallel to the first fins 15. The conducting-member 20 is higher than the first fins 15. The second fins 25 perpendicularly extend from the two opposite sides of the conducting member 20 and located above the first fins 15. The second fins 25 can be divided into two groups in respect to the conducting member 20. The two groups of the second fins 25 extend towards opposite directions, parallel to the base 10 and perpendicular to the first fins 15. The second fins 25 define a plurality of second air passages (not labeled) therebetween.

The heat pipe 30 comprises an evaporating portion 31 received in the channel defined by the groove 11, 21 of the base 10 and the conducting member 20 and thermally coupled with the base 10 and the bottom of the conducting member 20, a condensing portion 33 parallel to the evaporating portion 31 and received in a groove 22 defined in a top of the conducting member 20 far away from the base10, and an adiabatic portion 32 interconnecting the evaporating portion 31 and the condensing portion 33.

When the heat sink is applied to the heat-generating electronic element, the protrusion 12 of the base 10 contacts the electronic element and draws heat therefrom. The heat fast spreads on the base 10. One part of the heat is conducted to the first fins 15 via the base 10 for dissipation to an environment directly through the first fins 15. Another part of the heat is absorbed by the conducting member 20 and conducted upwardly to the second fins 25 for dissipation to the environment through the second fins 25. The other part of the heat is absorbed by the evaporating portion 31 of the heat pipe 30 and transferred to the top of the conducting member 20 which is thermally connected to the condensing portion 33 of the heat pipe 30. The other part of the heat is then transferred from the top of the conducting member 20 to the second fins 25 to be dissipated to the environment.

The heat sink can be fabricated by metal extrusion by which the base 10, the conducting member 20, and the fins 15, 25 are integrally formed and the heat pipe 30 is coupled with them. The protrusion 12 can be integrally formed with the base 10. Alternatively, the protrusion 12 can be made as a separate copper block and then soldered to a bottom of the base 10. Furthermore, the conducting member 20 and the second fins 25 can be formed as a separate unit from the base 10 and the first fins 15, and then connected to the base 10 by soldering the bottom of the conducting member 20 to the top surface of the base 10.

In the heat sink of the preferred embodiment of the present invention, the dimension of each of the first fins 15 and the second fins 25 is reduced. This facilitates manufacture of the heat sink in comparison with a typical extruded heat sink having a same volume. The conducting member 20 and the heat pipe 30 rapidly transfer the heat from the base 10 to the second fins 25 which is remote from the base 10 relative to the first fins 15 so that the second fins 25 are also sufficiently utilized as the first fins 15. Consequently, the heat sink has a higher heat dissipation performance.

In addition, the heat sink can be equipped with a fan (not shown), which is mounted adjacent to openings of the first and second air passages so as to provide a forced air flow through the first fins 15 and the second fins 25 for facilitating heat dissipation of the fins 15, 25. By the forced air flow, the heat dissipation effectiveness of the heat sink can be further promoted.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink comprising:
   a base with a plurality of first fins extending therefrom;
   a conducting member thermally coupled with the base, with the first fins arrayed into two groups separated by the conducting member;
   a plurality of second fins extending from two opposite sides of the conducting member toward different directions and substantially perpendicular to the first fins; and
   a heat pipe connecting the base and the conducting member, wherein the heat pipe is in the form of C and comprises an evaporating portion coupled with the base, a condensing portion parallel to the evaporating portion and coupled with the conducting member and an adiabatic portion interconnecting the evaporating portion and the condensing portion and located outside the base, the first fins, the conducting member and the second fins.

2. The heat sink as described in claim 1, wherein the first fins are perpendicular to the base and the second fins are perpendicular to the conducting member.

3. The heat sink as described in claim 2, wherein the second fins are parallel to the base.

4. The heat sink as described in claim 3, wherein the first fins are parallel to the conducting member.

5. The heat sink as described in claim 1, wherein the base, the first fins, the conducting member and the second fins are integrally fabricated by metal extrusion.

6. The heat sink as described in claim 1, wherein the conducting member is soldered to the base.

7. The heat sink as described in claim 1, wherein the base and the conducting member each define a groove, and the two grooves jointly form a passage in which the evaporating portion of the heat pipe extends.

8. The heat sink as described in claim 1, wherein the conducting member defines a groove in an upper portion thereof for receiving the condensing portion of the heat pipe.

9. The heat sink as described in claim 1, wherein the first fins extend between the base and the second fins.

10. A heat sink comprising:
    a base, with a plurality of first fins integrally extending from a surface of the base;
    a conducting member fixed on the base;
    a plurality of second fins integratedly extending from the conducting member parallel to the base, with the first fins located between the base and the second fins; and
    a heat pipe thermally connecting the base and the conducting member, wherein the heat pipe has a C-like shape and comprises an evaporating portion attached to the base, a condensing portion parallel to the evaporating portion and attached to the conducting member and an adiabatic portion interconnecting the evaporating portion and the condensing portion and located outside the base and the conducting member;
    wherein the first fins are parallel to the conducting member and arrayed by two sides of the conducting member.

11. A heat sink for a heat-generating electronic component, comprising:
    a base having a bottom surface adapted for thermally contacting the electronic component and a top surface opposite to the bottom surface;
    a plurality of first fins extending upwardly for the top surface of the base;
    a conducting member extending upwardly from the top surface of the base and located between the first fins;
    a plurality of second fins extending from the conducting member and located above the first fins, the second fins being oriented at a direction different from that of the first fins; and
    a heat pipe thermally connecting the base and an upper portion of the conducting member, wherein the heat pipe is C-shaped and comprises an evaporating portion attached to the base, a condensing portion parallel to the evaporating portion and attached to the conducting member and an adiabatic portion interconnecting the evaporating portion and the condensing portion and located outside the base, the first fins, the conducting member and the second fins.

12. The heat sink as described in claim 11, wherein the second fins extend horizontally outwardly from two opposite sides of the conducting member and are perpendicular to the first fins.

13. The heat sink as described in claim 12, wherein the base has a downward protrusion adapted for thermally contacting the electronic component.

* * * * *